US006220872B1

(12) United States Patent
Chen

(10) Patent No.: US 6,220,872 B1
(45) Date of Patent: Apr. 24, 2001

(54) MODULAR POWER SUPPLY

(75) Inventor: Chun-Chen Chen, TaoYuan (TW)

(73) Assignee: Delta Electronics, Tao Yuan (TW)

( * ) Notice: Subject to any disclaimer, the term of this patent is extended or adjusted under 35 U.S.C. 154(b) by 0 days.

(21) Appl. No.: 09/238,129

(22) Filed: Jan. 27, 1999

(51) Int. Cl.[7] ...................................................... H01R 1/00
(52) U.S. Cl. ............................................. 439/76.1; 439/79
(58) Field of Search .............................. 439/76.1, 79, 63, 439/535, 946

(56) References Cited

U.S. PATENT DOCUMENTS 5,772,453 * 6/1998 Tan et al. ................................. 439/79
5,788,511 * 8/1998 Burnworth et al. .................... 439/63
5,954,523 * 9/1999 Babcock ................................. 439/79

* cited by examiner

*Primary Examiner*—Paula Bradley
*Assistant Examiner*—Tho D. Ta

(57) ABSTRACT

A modular power supply, having a standard structure to engage with a variety of sockets, includes a casing, a circuit board and a plural number of sockets. The casing has an upper case engageable with a lower case to house the circuit board in between. The circuit board has circuits to convert alternate current into direct current and a connector room at one end thereof for engaging with a socket. In the connector room, there are provided with a pair of spaced terminal seats which has a standard interval in between, and a ground seat. The sockets can include a two-port socket, a three-port socket and a coaxial socket. Each socket has two terminals with the standard interval for engaging with the terminal seats. The three-port socket further has a ground terminal which is engageable with the ground seat.

6 Claims, 5 Drawing Sheets

MODULAR POWER SUPPLY

BACKGROUND OF THE INVENTION

1. Field of the Invention

The present invention relates to a modular power supply and more particularly to a power supply having standard structure and is engageable with various connectors.

2. Description of the Prior Art

The main function of a power supply in the art is to convert alternate current electricity (AC) from a power source into direct current electricity (DC) for powering electric or electronic devices desired. Generally, conventional power supplies may be categorized into a two-port power supply 10 as shown in FIG. 1A and a three-port power supply 20 as shown in FIG. 1B. However, both types of the power supplies are usually constructed similarly, including respectively a first and a second lower cases 11 and 21, a first and a second upper cases 12 and 22, a first and a second circuit boards 13 and 23 housed in a space formed between the lower and the upper cases, a first and a second wire openings 15 and 25 for connecting with an electrical device desired and a first and a second socket openings 16 and 26 for connecting with an external AC source. The main difference of above two types of power supplies is based on that the power supply 10 in FIG. 1A uses a first two-port socket 14, whereas the power supply 26 FIG. 1B uses a first three-port socket 24.

The first two-port socket 14 has a pair of spaced first terminals 141 engageable with a pair of first terminal bores 131 formed in the first circuit board 13 and a first two-port cavity 142 for connecting with a two-port type of connector to an AC source.

The second three-port socket 24 has a pair of spaced second terminals 241 engageable with a pair of second terminals bores 231 formed in the second circuit board 23, a second ground terminal 242 engageable with a second ground bore 232 in the second circuit board 23 and a second three-port cavity 243 for connecting with a three-port type of connector to an AC source.

The key difference between the two-port power supply 10 and the three port power supply 20 is the absence or existence of the ground terminal. To meet that difference, different toolings have to be set up for production. Thereby, the cost of production and maintenance is inevitably increased, and also the difference results in an interchangeable problem, which becomes an annoyance to most users.

SUMMARY OF THE INVENTION

In view of aforesaid disadvantages, it is therefore an object of the present invention to provide a modular power supply consisting of standard components for reducing production cost.

It is another object of the present invention to provide a modular power supply that has a pair of standard terminal seats, which are engageable with various types of sockets such as a two-port socket without a ground terminal, a three-port socket with a ground terminal, or a coaxial socket.

It is a further object of the present invention to provide a modular power supply that is able to use different types of output sockets such as two-port, three-port or coaxial type to meet different shapes of AC connectors.

The modular power supply according to the present invention aims at converting AC power. It includes a casing, a circuit board and a plural number of connectors.

The casing includes an upper case engageable with a lower case to form an accommodation space in between for housing the circuit board.

The circuit board has a wire opening at one end for engaging with an electrical device desired and a socket opening at another end, in which has a pair of two-polarity terminal seats and a ground seat formed therein. The pair of the terminal seats are spaced by a predetermined interval.

The connectors may include a two-port socket, a three-port socket, and a coaxial socket, for forming different types of AC connector. Each aforesaid socket has two terminals with a spacing of the predetermined interval.

Each socket has a cavity assessable from outside of the casing to serve as power outlet for coupling with AC sources. The terminal and ground seats may be formed in bore shape. The ground seat may be located between the terminal bores at the same side or at an opposite side to form an overhead connector to suit devices desired.

BRIEF DESCRIPTION OF THE DRWAINGS

The present invention, as well as its many advantages, may be further understood by the following detailed description and drawings in which.

DETAILED DESCRIPTION OF THE PREFERRED EMBODIMENT

The invention disclosed herein is directed to a modular power supply. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

The modular power supply in accordance with the present invention aims at providing a standard structure to suit various types of sockets used in different shapes of AC connectors.

Figure 1:
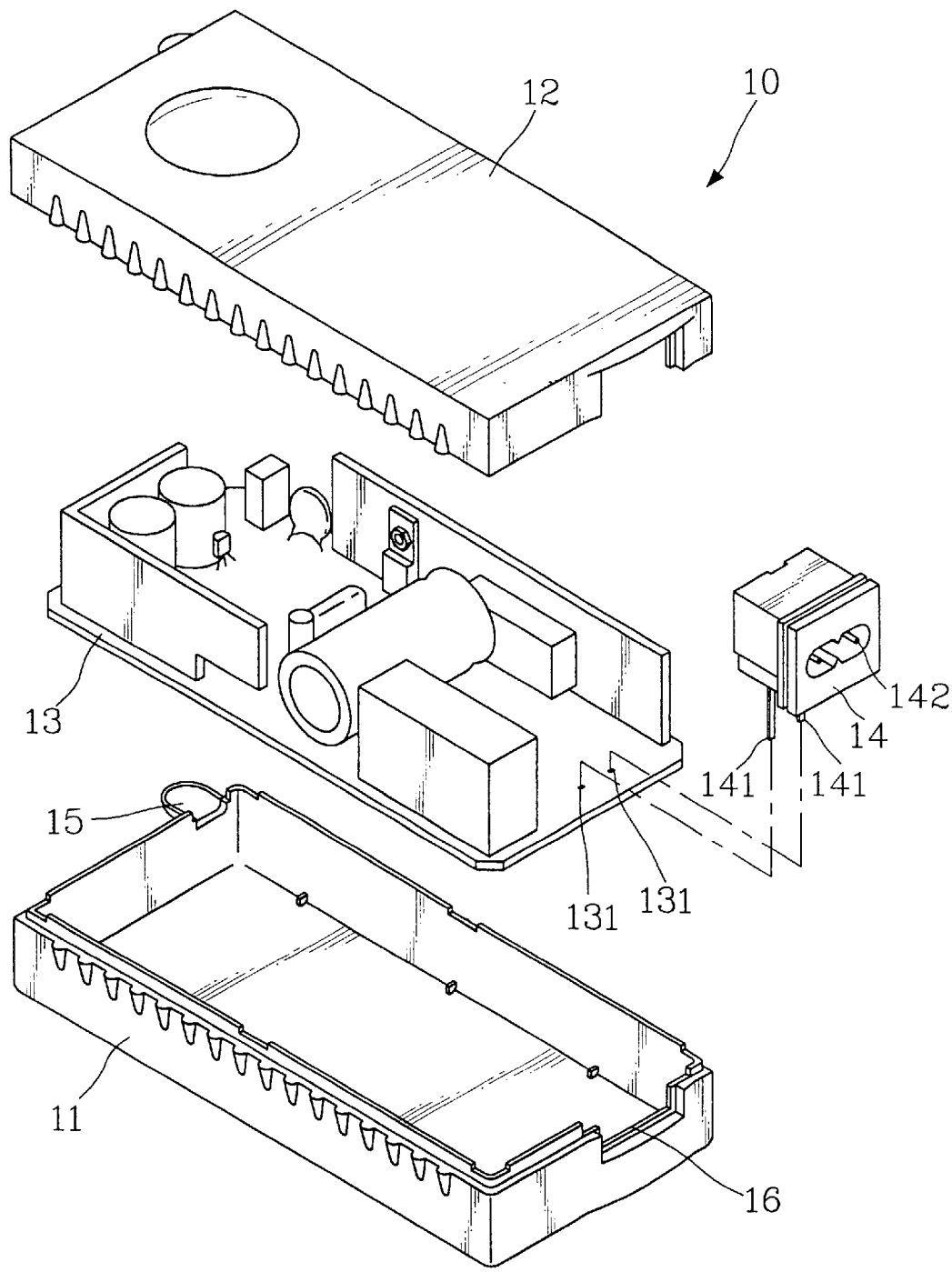
FIG. 1A is an exploded perspective view of a conventional two-port power supply.
FIG. 1B is an exploded perspective view of a conventional three-port power supply.
Figure 1:
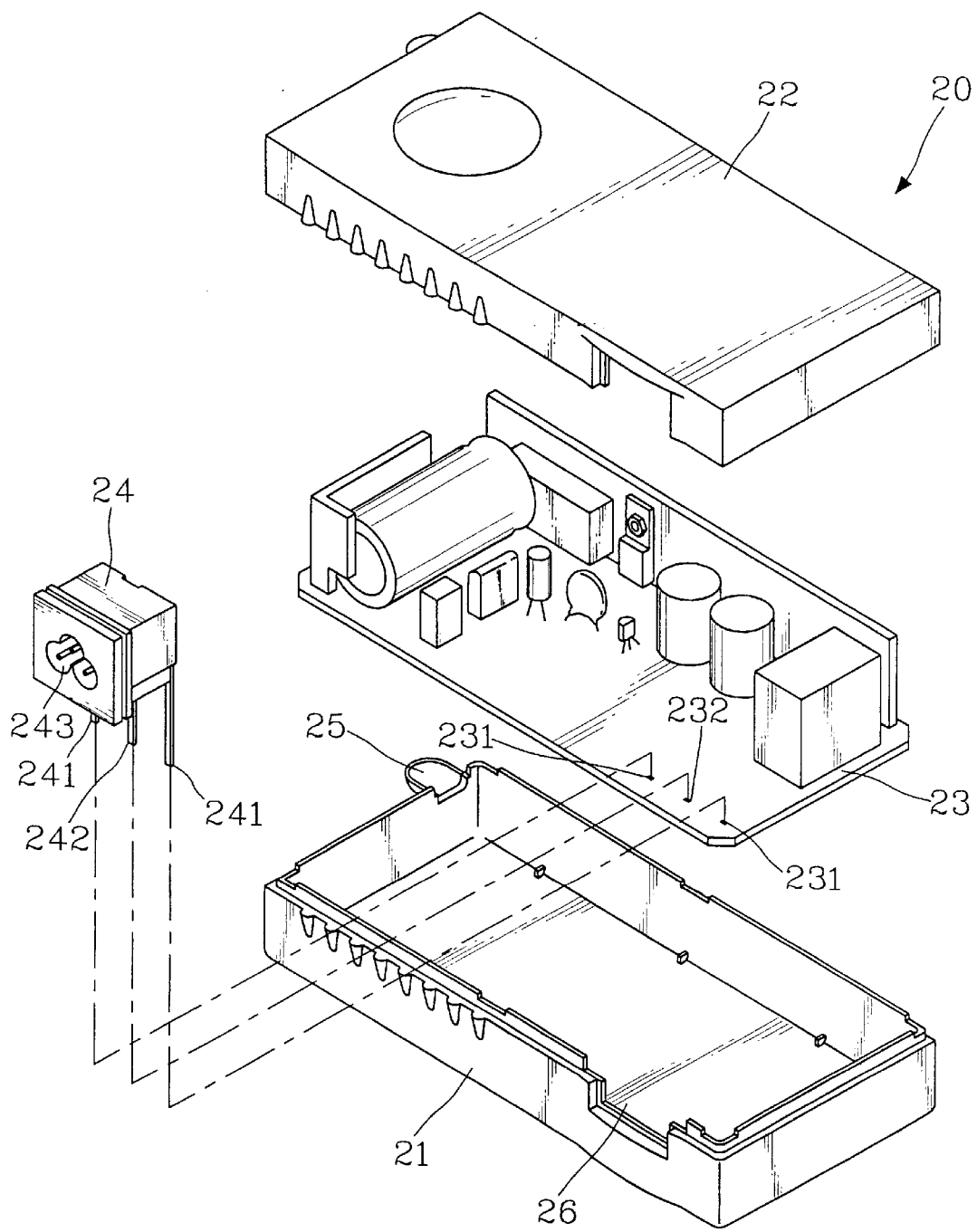
Figure 2:
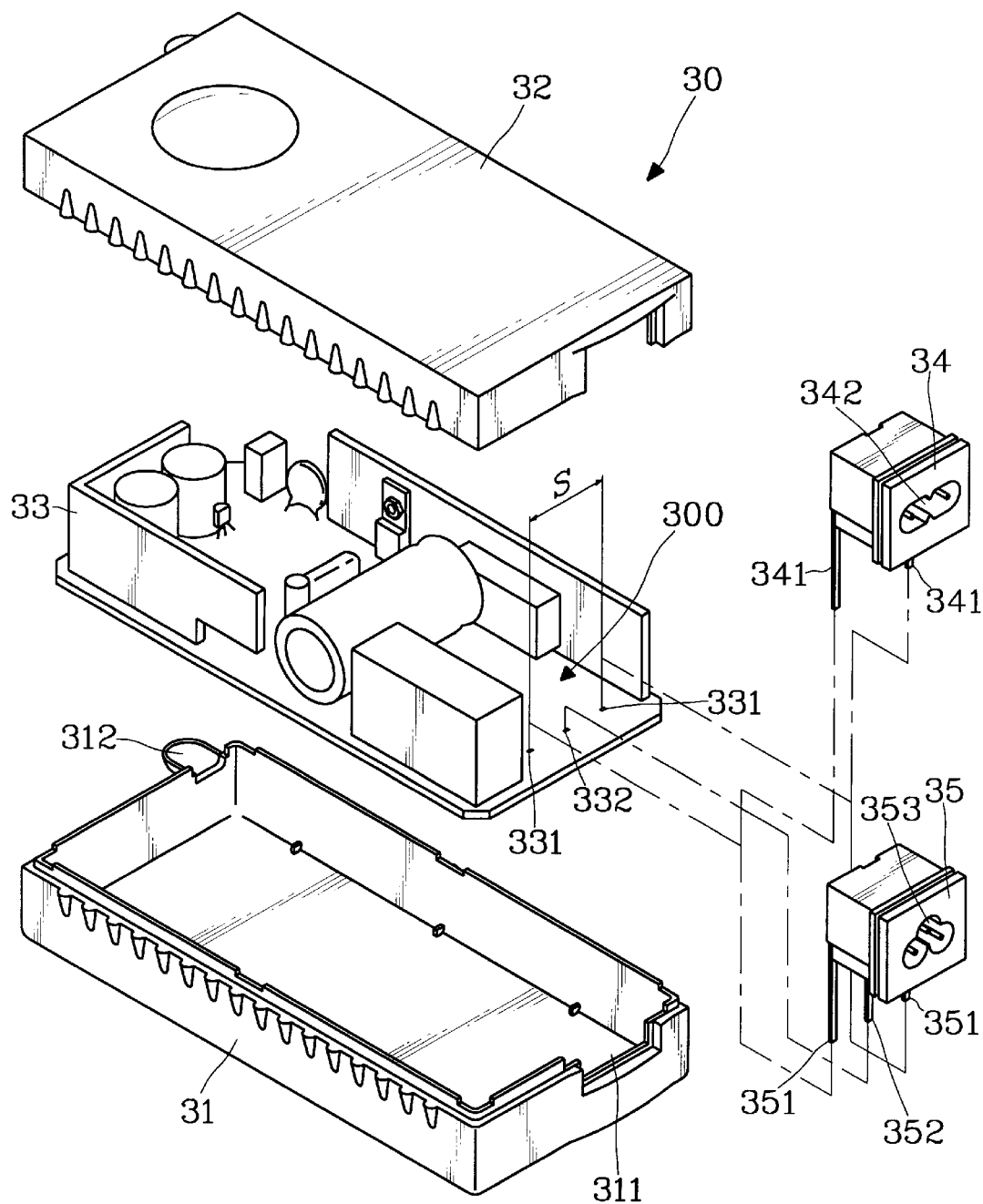
FIG. 2 is an exploded perspective view of a first embodiment of the present invention.

FIG. 2 illustrates detailed structure of a first embodiment of the present invention. The modular power supply 30 of this embodiment is generally constructed like the ones shown in FIGS. 1A and 1B. It has a casing which includes a third lower case 31 engageable with a third upper case 32 to house a third circuit board 33 in between. The third circuit board 33 has a third wire opening 312 at one end of the casing, a third socket opening 311 at another end thereof and a third connector space 300 behind the third socket opening 311.

The third wire opening 312 is for the third circuit board 33 to connect with a desired electrical device. The third connector space 300 is to house at least one of two types of sockets; i.e. a third two-port socket 34 or a third three-port socket 35, each with a third cavity 342 or a fourth cavity 353 extending out of the third socket opening 311 for connecting with an AC source. At the third circuit board 33 within the third connector space 300, there is provided with a pair of spaced third terminals bores 331 having an predetermined interval S between them, and a third ground bore 332 located in the middle between the third terminal bores 331.

The third two-port socket 34 and the third three-port socket 35 have respectively the pair of terminals 341 or 351. The distance between each pair of terminals 341 and 351 equals the interval S. Furthermore, the terminals 341 and 351 are shaped for engagement with the terminal's bores 331. In addition, the third three-port socket 35 has a third ground terminal 352 which is engageable with the third ground bore 332. Therefore, either the socket 34 or 35 may be mounted and engaged with the third circuit board 331 in the third connector space 300.

Figure 3:
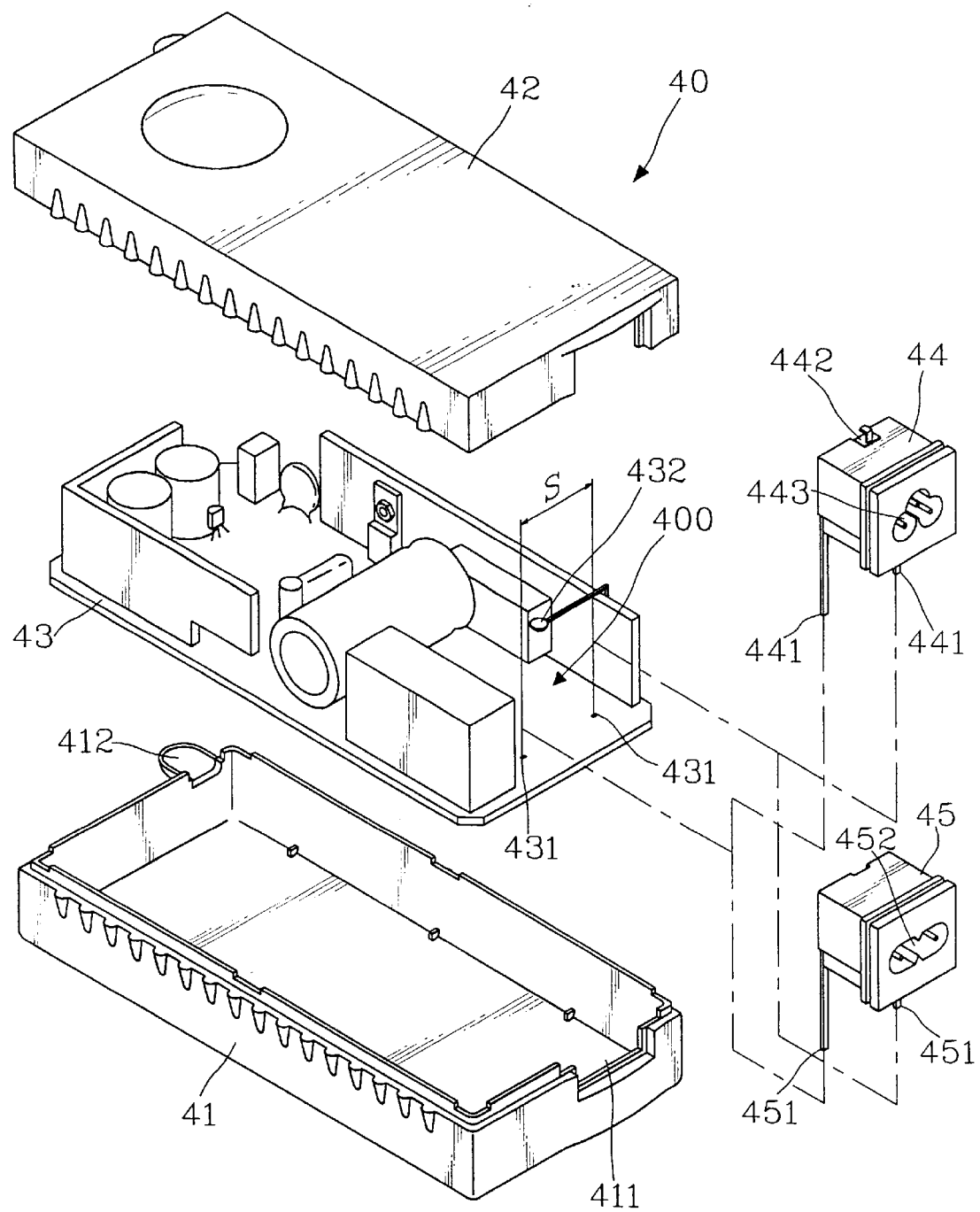
FIG. 3 is an exploded perspective view of a second embodiment of the present invention.

FIG. 3 illustrates a second embodiment 40 of the present invention. It is constructed like the one shown in FIG. 2. It has a fourth lower case 41 engageable with a fourth upper case 42 to house a fourth circuit board 43 in between. In the fourth circuit board 43, there is also a fourth 30 wire opening 412, and a fourth socket opening 411 and a fourth connector space 400. In the fourth connector space 400, there is also a pair of fourth terminal bores 431 spaced apart at the interval S. However, a fourth ground bore 432 is located above the fourth connector space 400. A fourth three-port socket 44 which has a pair of spaced fourth terminals 441, a 35 fourth ground terminal 442 at the top thereof and a fourth thee-port cavity 443 may be mounted and engaged with the fourth circuit board 43 in the fourth connector space 400. Same practice may be applied to a fourth two-port socket 45 which has a pair of fifth terminals 451 and a fourth two-port cavity 452, but no ground terminal. The fourth ground bore 452 is idle for the fourth two-port socket 45.

The cavities 443 and 452 are respectively extending outward from the fourth socket opening 411 for providing an AC connector to AC source.

Figure 4:
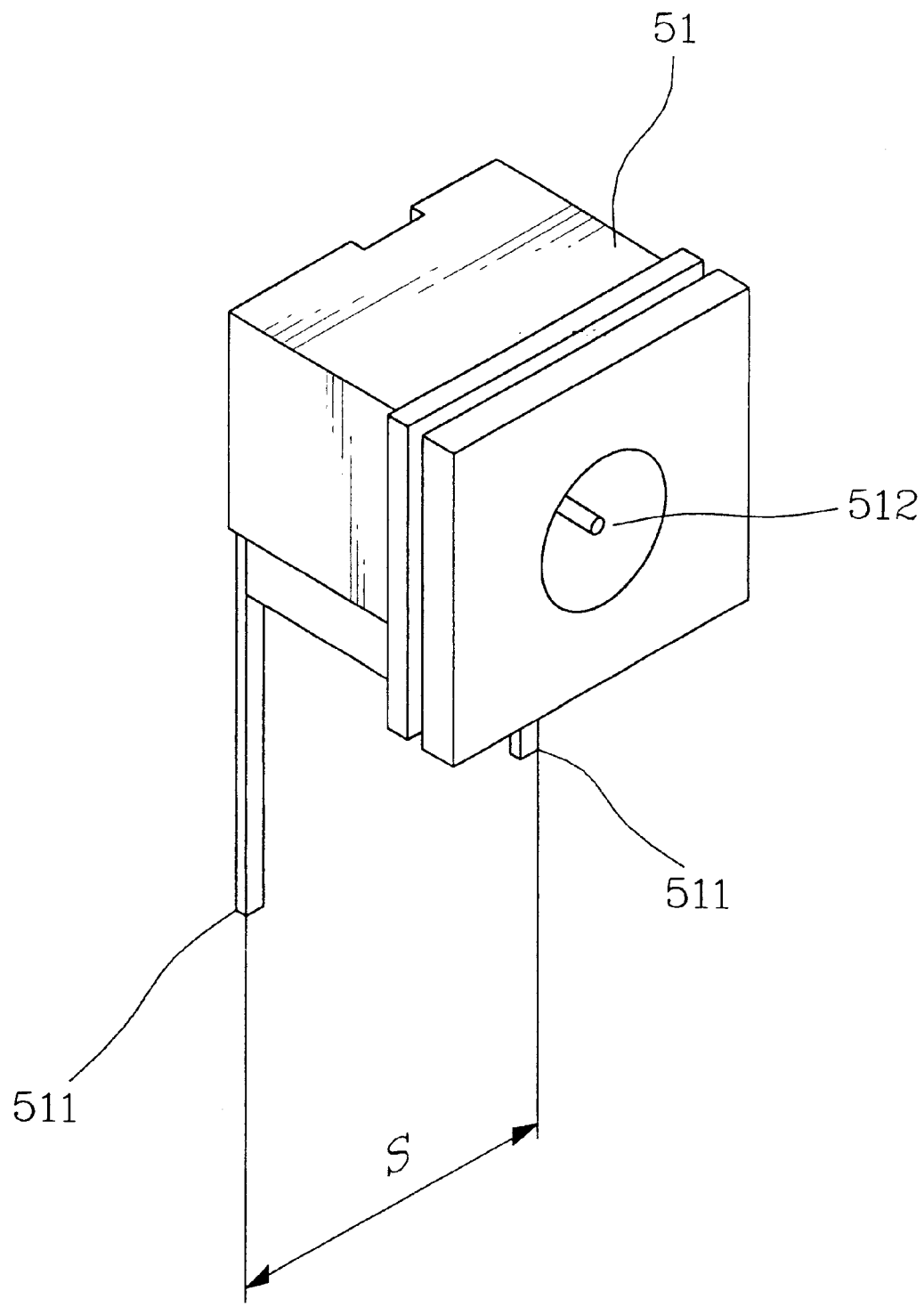
FIG. 4 is a perspective view of a coaxial connector of the present invention.

FIG. 4 shows another embodiment of the present invention for a coaxial connector 51. It has a pair of sixth terminals 511 spaced apart at the interval S to engage with the terminal bores in the circuit board such as 331 in FIG. 2 or 431 in FIG. 3. It has a coaxial socket 512 to hook up with an electronic or electric device desired.

It thus may be seen that the present invention provides a standard terminal bore interval in the circuit board and socket terminal interval, so that it may accommodate two-port, three-port or coaxial socket now widely used in the market. It may be mass-produced by one set of mold at low cost to satisfy a wide variety of electronic and electric devices.

While the present invention has been particularly shown and described with reference to preferred embodiments, it will be understood by those skilled in the art that various changes in form and detail may be without departing from the spirit and scope of the present invention.

What is claimed:

1. A modular power supply assembly, comprising:

a casing having an upper case coupled to a lower case to form a space therebetween;

a circuit board positioned in the space and having one end engageable with an alternate power source and another end having a connector room which has a pair of two-polarity first terminal seats and a ground seat, the first terminal seats having an interval between them;

a two-port socket having a pair of terminals spaced from each other at the same interval as the interval between the first terminal seats, and engageable with the first terminal seats, the two-port socket further having a two-port power inlet; and a three-port socket having a pair of terminals spaced from each other at the same interval as the interval between the first terminal seats, and engageable with the first terminal seats, a ground terminal engageable with the ground seat, the three-port socket further having a three-port power inlet;

wherein the two-port socket and the three-port socket are interchangeably mounted in the same connector room for different uses.

2. The modular power supply of claim 1, wherein the ground seat is located between the first terminal seats.

3. The modular power supply of claim 1, wherein the ground seat is located above the first terminal seats.

4. The modular power supply of claim 1, wherein the first terminal seats are formed in bores.

5. The modular power supply of claim 1, wherein the ground seat is formed in a bore.

6. The modular power supply of claim 1, wherein the connector room is engageable with a coaxial socket which has a pair of fourth terminals engageable with the first terminal seats and a coaxial cavity for power inlet.

* * * * *